United States Patent
Yamasaka

[11] Patent Number: 5,968,282
[45] Date of Patent: Oct. 19, 1999

[54] MECHANISM AND METHOD FOR CLEANING PROBE NEEDLES

[75] Inventor: Rikihito Yamasaka, Yamanashi-ken, Japan

[73] Assignee: Tokyo Electron Limited, Tokyo, Japan

[21] Appl. No.: 09/186,140

[22] Filed: Nov. 5, 1998

[30] Foreign Application Priority Data

Nov. 10, 1997 [JP] Japan .................................. 9-323756

[51] Int. Cl.⁶ ........................................................ B08B 1/00
[52] U.S. Cl. ...................... 134/6; 15/4; 15/21.1; 15/97.1; 15/114; 324/754; 324/761; 134/8; 134/18; 134/22.1; 134/22.11; 134/25.5; 134/40
[58] Field of Search .............................. 15/4, 21.1, 97.1, 15/114; 324/754, 761; 134/6, 8, 18, 22.1, 22.11, 25.5, 40

[56] References Cited

U.S. PATENT DOCUMENTS

| | | | |
|---|---|---|---|
| 3,641,610 | 2/1972 | Lewis, Jr. | 15/114 |
| 3,999,239 | 12/1976 | Misuna | 15/88 |
| 4,131,966 | 1/1979 | Gross | 15/28 |
| 4,244,074 | 1/1981 | Barcikowski et al. | 15/114 |
| 4,314,855 | 2/1982 | Chang et al. | 134/3 |
| 4,517,702 | 5/1985 | Jackson | 15/114 |
| 4,590,422 | 5/1986 | Milligan | 324/158 F |
| 4,845,799 | 7/1989 | Amundson | 15/114 |
| 5,172,053 | 12/1992 | Itoyama | 324/158 F |
| 5,220,279 | 6/1993 | Nagasawa | 324/158 P |
| 5,249,325 | 10/1993 | Wilen | 15/4 |
| 5,312,197 | 5/1994 | Abramson | 401/6 |
| 5,349,715 | 9/1994 | Lewis, Jr. | 15/114 |
| 5,591,507 | 1/1997 | Jones | 428/88 |
| 5,623,213 | 4/1997 | Liu et al. | 324/754 |
| 5,666,063 | 9/1997 | Abercrombie et al. | 324/754 |
| 5,728,229 | 3/1998 | Després | 134/2 |
| 5,778,485 | 7/1998 | Sano et al. | 15/301 |
| 5,814,158 | 9/1998 | Hollander et al. | 134/3 |

*Primary Examiner*—Jill Warden
*Assistant Examiner*—S. Carrillo
*Attorney, Agent, or Firm*—Oblon, Spivak, McClelland, Maier & Neustadt, P.C.

[57] ABSTRACT

A cleaning mechanism and method for cleaning the probe needles of a probe card used for the inspection of the electric characteristics of a wafer W. This mechanism is provided with a soft cleaner and a brush cleaner. The soft cleaner has a cleaner layer formed of rubber and inorganic filler. The brush cleaner has a number of brush sections, and each brush section is a bundle of fiber members. The fiber members are thinner than the probe needles and have a certain degree of elasticity. The cleaning method includes the steps of: a) cleaning the probe needles using the soft cleaner having a the cleaning layer made of rubber and inorganic filler and b) cleaning the probe needles using the brush cleaner having bristles.

6 Claims, 3 Drawing Sheets

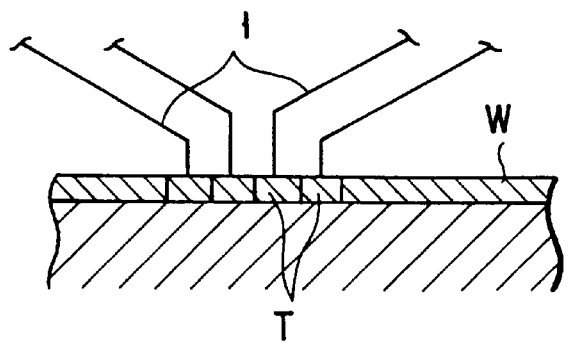
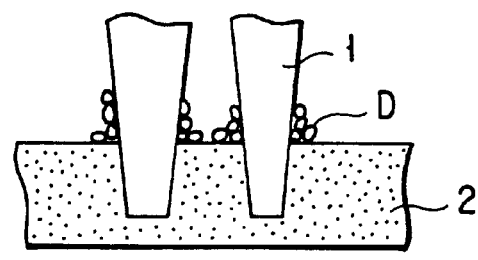
FIG. 6
PRIOR ART
FIG. 7
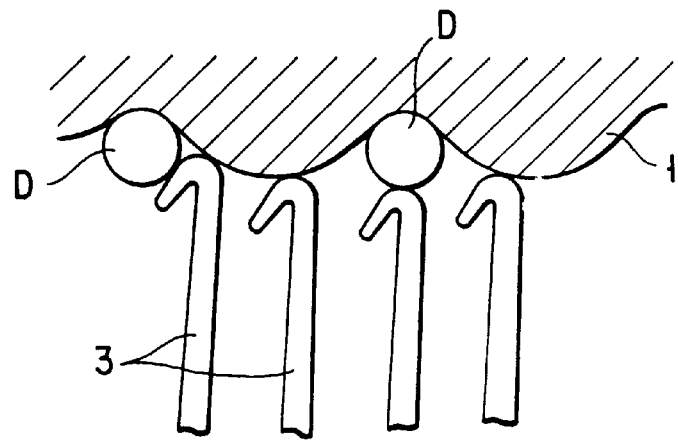
FIG. 8
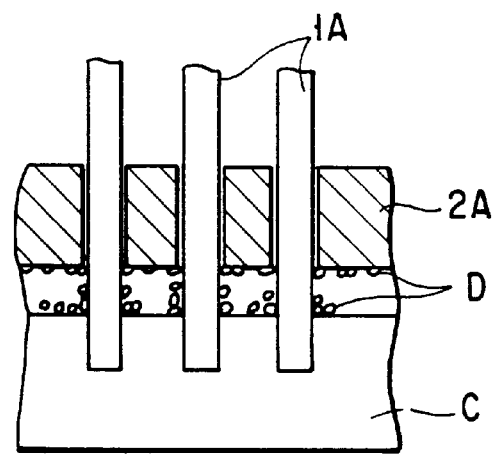
FIG. 9

MECHANISM AND METHOD FOR CLEANING PROBE NEEDLES

BACKGROUND OF THE INVENTION

The present invention relates to a cleaning mechanism and a cleaning method, which are adapted for cleaning the probe needles of a probing apparatus used for inspecting the electric characteristics of an object under electrical inspection.

A large number of semiconductor devices (hereinafter referred to as chips) formed on a semiconductor wafer (hereinafter referred to simply as a wafer) are an example of the object that should be inspected by the subject apparatus. A probing apparatus is employed to inspect the electric characteristics of the chips formed on the wafer.

For inspection, the wafer is placed on the main chuck, which is arranged inside the apparatus and movable in the X, Y, Z and θ directions. The wafer is index-fed by moving the main chuck. As shown in FIG. 6, the probe needles 1 of a probe card are brought into contact with the electrode pads (not shown) of the chips on the wafer that is being index-fed during inspection. The electrodes of the chips are electrically connected to a tester, so as to inspect the electric characteristics of the chips.

In order to achieve reliable electric connection between the probe needles 1 and the electrode pads, the electrode pads, which are formed of aluminum, must be processed to remove a natural oxide film therefrom. The natural oxide film on the electrode pads is scraped off by using of the probe needles 1.

However, if this inspection process is repeated, aluminum oxide or other undesirable substance will adhere to the tips of the probe needle 1. If such undesirable substance as aluminum oxide is present, the probe needles 1 may not be electrically connected to the electrode pads of the chips. To solve this problem, the conventional art employs a main chuck provided with an abrasive plate. The tip ends of the probe needles 1 are cleaned by means of the abrasive plate, for the elimination of adherent substance.

FIG. 6 shows a structure wherein a plurality of probe needles 1 are supported on a probe card at one end. The probe needles 1 are arranged in such a manner that they can be simultaneously brought into contact with the electrodes arranged in rows.

However, the conventional cleaning method has the problem that the substance adherent to the abrasive plate will scatter at the time of polishing. In addition, the abrasive plate is horizontally projected from the wafer chuck. Due to this structure, in order to polish all probe needles 1 by use of the same abrasive plate, the wafer chuck has to be moved greatly in such a manner that the probe needles are all brought into contact with the abrasive plate without exception. As long as the moving range of the wafer chuck is wide, the apparatus is inevitably large in size.

The present applicant developed a technique for preventing generation of particles, such as those generated when the substance adherent to the probe needles is removed and scattered, and filed a patent application to claim that technique (Japanese Patent Application No. 9-106616). The technique is directed to a soft cleaner 2 comprising a cleaner layer that is formed of rubber and inorganic filler (see FIG. 7). The present applicant also developed a cleaning mechanism comprising a brush cleaner (not shown) that has a cleaner layer, and filed a patent application (Japanese Patent Application No. 9-220247). This cleaning mechanism enables all probe needles of a probe card to be cleaned, with no need to provide a wide space inside the apparatus.

A further study was made of the soft cleaner and brush cleaner described above, and it was found out that the cleaners needed improvement in the following points. In the case where the soft cleaner 2 is employed, the probe needles 1 are stabbed into the soft cleaner 2, as shown in FIG. 7. At the time, the substance D adherent to the surface of the probe needles, such as abraded particles, are rubbed off the surface and collected in the neighborhood of the upper portion of the probe needles. However, such substance may partially remain on the probe needles 1. Moreover, it should be noted that the surfaces of the probe needles 1 have been subjected to sand blast processing, as shown in FIG. 8. When the substance D is cleaned away from the tiny depressions formed in the surface of the probe needles by means of the brush cleaner, the tip ends of the bristles of the brush are bent, as shown in FIG. 8. Since the bristles are soft in this manner, the substances in the tiny depressions cannot be fully removed.

In the case where a probe card that supports probe needles 1A upright is employed, the substance D from the electrode pads will adhere not only to the probe needles 1A but also to the support plate 2A used for supporting them. However, the substance D adherent to the support plate 2A cannot be removed therefrom by means of the soft cleaner or brush cleaner described above. The remaining substance D may come off the support plate 2A and drop onto a wafer under inspection, resulting in unreliable examination.

BRIEF SUMMARY OF THE INVENTION

An object of the present invention is to provide a solution to the problems described above.

Another object of the present invention is to provide a cleaning mechanism and a cleaning method, which can effectively remove an adherent substance from all probe needles of a probe card, with no need for an increased installation area of the probe apparatus.

According to the first aspect of the present invention, there is provided a cleaning mechanism which is designed for cleaning probe needles used for inspecting electric characteristics of an object, and which comprises:

at least one brush cleaner having bristles which are formed of fiber members thinner than the probe needles; and at least one soft cleaner having a cleaner layer made of rubber and inorganic filler.

According to the second aspect, there is provided a cleaning mechanism wherein the fiber members are stiff but bendable at any lengthwise portion thereof.

According to the third aspect, there is provided a cleaning mechanism wherein the brush cleaner includes:

an X brush cleaner shifted from the soft cleaner in one direction; and a Y brush cleaner shifted from the soft cleaner in another direction.

According to the fourth aspect, there is provided a cleaning mechanism which is adapted for cleaning probe needles and in which the bristles of the brush cleaner are made of at least one of two kinds of fibers that include glass fibers and carbon fibers. According to the fifth aspect, there is provided a cleaning method which is conceived for cleaning probe needles used for inspecting electric characteristics of an object, and which comprises the steps of:

cleaning the probe needles by use of a soft cleaner having a cleaner layer made of rubber and inorganic filler; and cleaning the probe needles by use of a brush cleaner having bristles which are formed of fiber members thinner than the probe needles.

According to the sixth aspect, there is provided a cleaning method which is adapted for cleaning probe needles and in which the bristles of the brush cleaner are made of at least one of two kinds of fibers that include glass fibers and carbon fibers.

According to the seventh aspect, there is provided a cleaning mechanism which is designed for cleaning probe needles used for inspecting electric characteristics of an object, and which comprises:

at least one brush cleaner having bristles which are formed of fiber members thinner than the probe needles; and at least one sandpaper cleaner.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6 is a sectional view showing how a wafer is examined by use of the probe card, the probe needles and the wafer being illustrated on an enlarged scale.

FIG. 7 shows how the probe needle depicted in FIG. 6 is cleaned by use of a soft cleaner, and specifically shows the relationship between a probe and the soft cleaner.

FIG. 8 shows how the probe needle depicted in FIG. 6 is cleaned by use of a brush cleaner, and specifically shows the relationship between the probe needle and the bristles.

FIG. 9 shows how vertically-support type of probe needles are cleaned by use of a soft cleaner, and specifically shows the relationship between the probe needle and the soft cleaner.

DETAILED DESCRIPTION OF THE INVENTION

Figure 1:
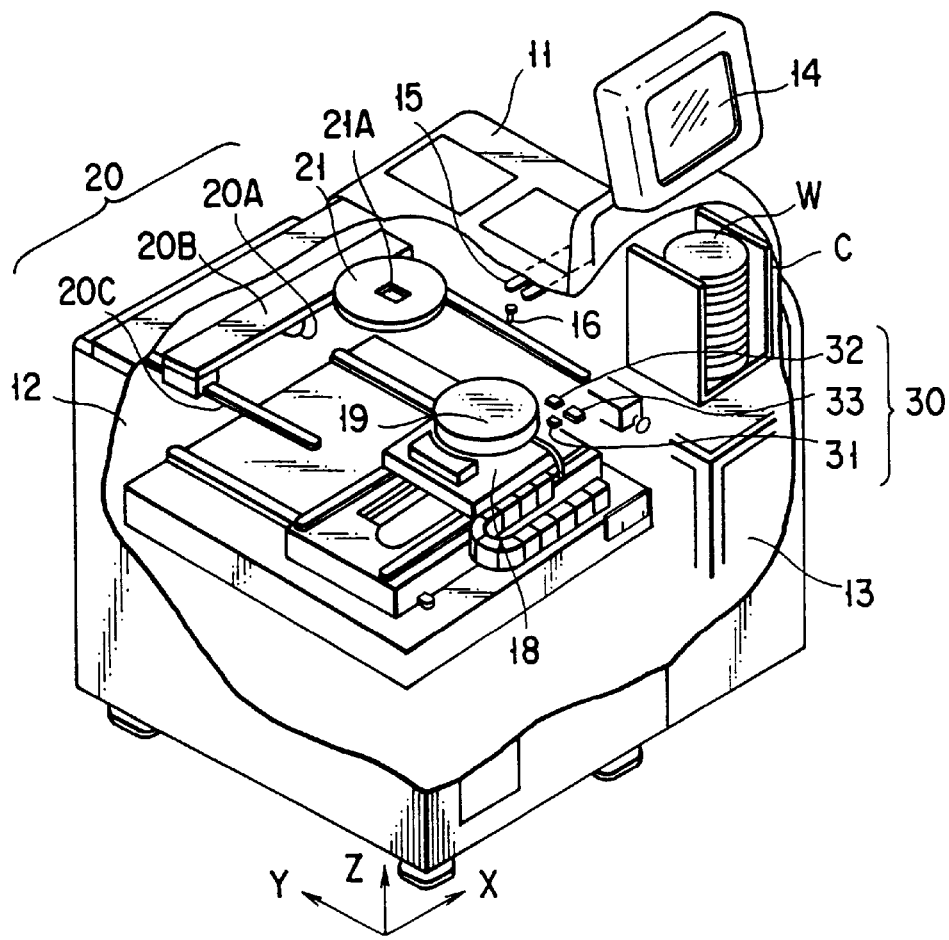
FIG. 1 is a partially-cutaway perspective view showing the internal structure of a cleaning mechanism according to one embodiment of the present invention.

A probing apparatus comprising a cleaning mechanism according to one embodiment of the present invention will be described with reference to FIGS. 1 to 5. As shown in FIG. 1, the probing apparatus 10 is provided with a loader chamber 11 from which a wafer W in a cassette C is conveyed; a prober chamber 12 for inspecting the wafer conveyed from the loader chamber 11; a controller 13 for controlling the prober chamber 12 and the loader chamber 11; and a display device 14 serving also as a control panel by means of which the controller 13 is operated.

The loader chamber 11 is provided with a wafer conveyance mechanism 15 and a sub chuck 16. While the wafer conveyance mechanism 15 is conveying the wafer W to the prober chamber 12, the sub chuck 16 executes pre-alignment of the wafer W, on the basis of an orientation flat provided on the wafer W.

The prober chamber 12 comprises: a main chuck 19 which can be driven in the X, Y, Z and θ directions and the temperature of which is adjustable; an alignment mechanism 20 for aligning the wafer W on the main chuck 19; and a probe card 21 having probe needles 21A that are used for electrical inspection of the aligned wafer W.

The alignment mechanism 20 comprises upper and lower CCD cameras 20A, an alignment bridge 20B and a pair of guide rails 20C. The CCD cameras serve as an image recognition device. (In FIG. 1, only the upper CCD camera is shown. The lower CCD camera, not illustrated in FIG. 1, is provided for the main chuck.) The alignment bridge 20B is a member on which the upper CCD camera 20A is provided in such a manner that it is directed downward. The alignment bridge 20B is guided in the Y direction along the guide rails 20C. A head plate, which can be opened or closed, is provided on top of the prober chamber 12. The head plate has an opening, in which a probe card 21 is fixed by means of an insert ring. A test head (not shown) is moved to the region above the probe card 21, so as to electrically connect the probe card 21 to a tester (not shown). Predetermined signals from the tester are supplied to the wafer W on the main chuck 19 through the probe card 21. On the basis of the signals, the tester electrically inspects the chips formed on the wafer W.

Figure 2:
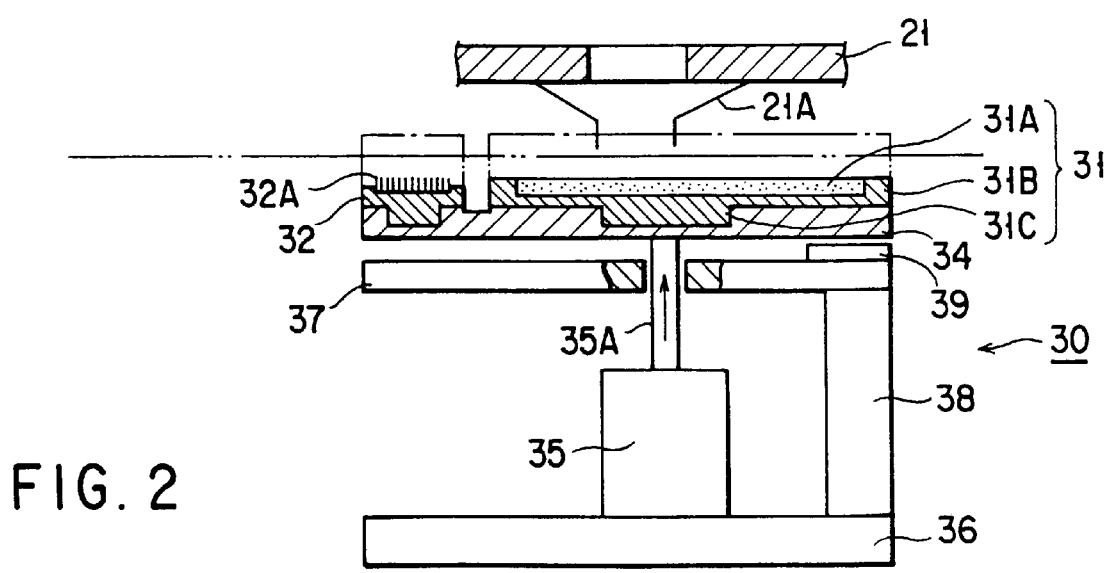
FIG. 2 is a sectional view showing how a probe card is cleaned by means of the cleaning mechanism shown in FIG. 1.

The main chuck 19 comprises a cleaning mechanism 30. As shown in FIGS. 1 and 2, the cleaning mechanism 30 is made up of: a soft cleaner 31 provided at one position; brush cleaners 32 and 33 provided at two positions, respectively; a support base 34 for supporting the cleaners 31, 32 and 33 as one body; an air cylinder 35 coupled to the support base 34 by means of a cylinder rod 35A; and a base member 36 for supporting the air cylinder 35. As shown in FIG. 2, the soft cleaner 31 and the brush cleaners 32 and 33 are driven by the air cylinder 35 and movable between the position indicated by a solid line and the position indicated by a one-dot-chain line. The position indicated by a two-dot-dash line is slightly lower in level than the position indicated by the one-dot-chain line. The surface of the wafer W placed on the main chuck 19 is situated at the position of the two-dot-chain line.

A base plate 37 is arranged right under the support base 34 such that it is parallel to the support base 34. The base plate 37 is supported, with its horizontal posture maintained, by a column 38 which stands upright on the base member 36. A micro switch 39 is arranged on the base plate 37 so as to detect the lower end of the support base 34. As shown in FIG. 1, the brush cleaners 32 and 33 are shifted slightly from the soft cleaner 31 in the X and Y directions, respectively. The surfaces of the cleaners 32 and 33 are flush with each other. In the descriptions below, the brush cleaner 32 shifted in the X direction will be referred to as an X brush cleaner 32, while the brush cleaner 33 shifted in the Y direction will be referred to as a Y brush cleaner 33.

As shown, for example, in FIG. 2, the soft cleaner 31 is made up of a cleaner layer 31A formed of rubber and filler; and a container section 31B which is flat and rectangular. A projection 31C is formed in the center of the bottom of the container section 31B. The projection 31C is fitted in the depression formed in the support base 34. The rubber of the cleaner layer 31A may be either natural rubber or synthetic rubber, but the use of silicone rubber, which is one kind of synthetic rubber, is desirable. The filler of the cleaner layer 31A serves as grinding particles and is preferably selected from the group including silica sand, glass particles, alumina particles, and ceramic particles. Particles of one of these kinds may be used singly. Alternatively, the particles of two or more may be mixed together. As the soft cleaner 31, the cleaner proposed in Japanese Patent Application No. 9-106616 filed by the present applicant can be used.

Figure 3A:
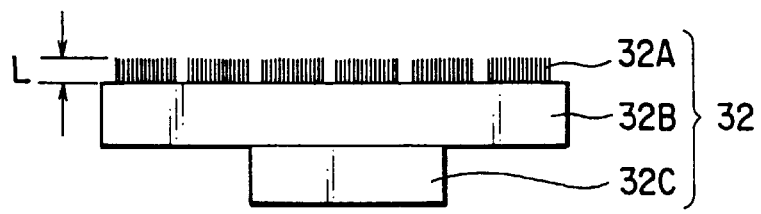
FIG. 3A is a side view of the brush cleaner depicted in FIG. 1.
Figure 3B:
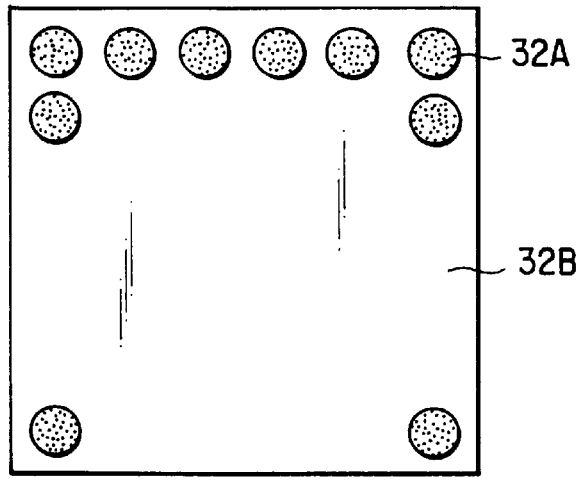
FIG. 3B is a plan view of part of the brush cleaner depicted in FIG. 1.
Figure 4:
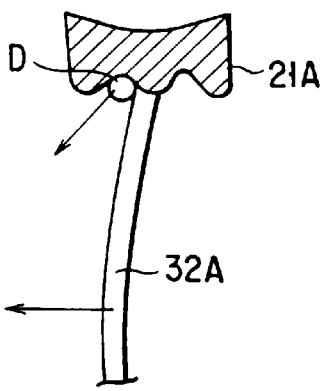
FIG. 4 is a schematic diagram showing how a fiber member of the brush cleaner shown in FIGS. 3A and 3B operates.

As shown, for example, in FIGS. 2, 3A and 3B, the X brush cleaner 32 has a rectangular base 32B. A number of brush 32A, each made of a bundle of fiber members, are arranged in a matrix on the base 32B. A projection 32C is formed in the center of the lower side of the base 32B. The projection 32C is fitted in the depression of the support base 34. As shown in FIG. 4, the fiber members of each brush 32A are thinner than the probe needles 21A, and when they are brought into contact with the tip ends of the probe needles 21A, they curve throughout their length. In other words, the fiber members can be curved and yet has a certain degree of elasticity. As the fiber members of each brush 32A are bundled, they will be referred to as a fiber bundle. As the fiber members, glass fibers that are thinner than the probe needles 21A may be employed. As shown in FIG. 4 on an enlarged scale, the tip end portion of a fiber member is not bent and enters a tiny depression formed in the tip end surface of the probe needle 21A. Due to the elasticity of the fiber member, the substance present in the tiny depression is removed. If the fiber members do not have a sufficient degree of elasticity, their tip ends will be bent, as shown in FIG. 9, thus failing to remove the adherent substance D in a reliable manner.

In the case of probe needles 21A whose diameters are within the range of 200 to 350 $\mu$m, the fiber members used should preferably be one kind of glass fibers whose diameters are in the range of 6 to 8 $\mu$m, carbon fibers whose diameters are in the range of 20 to 30 $\mu$m, etc. Alternatively, two or more of these kinds of fibers are mixed together for use. Even in the case where the fiber members have a certain degree of elasticity, they should not be very long. If they are too long, they will be bent easily. In the present embodiment, the fiber members of each brush 32A are glass fibers whose diameter are 8 $\mu$m.

Figure 5:
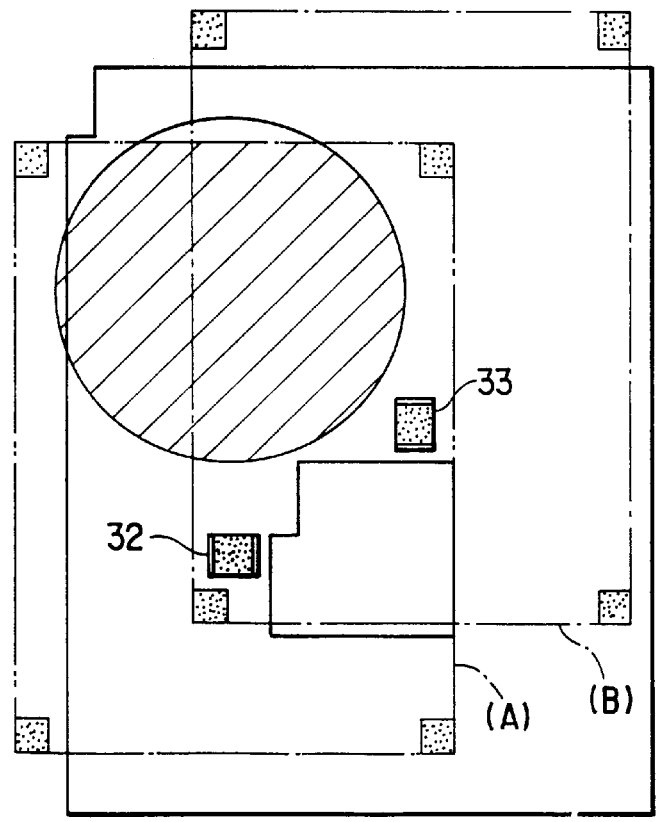
FIG. 5 is an explanatory diagram showing the ranges cleaned by the X and Y brush cleaners.

The cleaning method according to one embodiment of the present invention, which uses the cleaning mechanism 30 described above, will be described with reference to FIGS. 4 and 5. FIG. 4 is a schematic diagram showing how a fiber member of the brush cleaner removes substance from a probe needle tip end that has been subjected to sand blast processing. FIG. 5 is a plan view showing the ranges that can be cleaned by the brush cleaners 32 and 33.

As described above, after a probe needle 21A is repeatedly brought into contact with an aluminum electrode pad, a substance D, such as aluminium oxide, adheres to the tip end of the probe needle 21A. The adherent substance D may affect the inspection subsequently carried out. To avoid this problem, the present cleaning method, which uses the cleaning mechanism of the present invention, is adopted to clean all probe needles 21A and thereby remove adherent substance D from them.

First of all, each probe needle 21A is cleaned by the soft cleaner 31 of the cleaning mechanism 30. Subsequently, it is cleaned by the two brush cleaners 32 and 33. The substance D adherent to each probe needle 21A is surely eliminated by executing the two-step cleaning.

More specifically, the air cylinder 35 of the cleaning mechanism 30 is driven under the control of the controller 13. The piston rod 35A extends, as indicated by the arrow in FIG. 2, thereby causing the support base 34 to move up from the solid-line position to the one-dot-chain line position. In this state, the surfaces of the soft cleaner 31 and brush cleaners 32 and 33 are slightly higher in level than the surface of the wafer W placed on the main chuck 19 (the surface of the wafer W is at the position indicated by the two-dot-chain line in FIG. 2), and a cleaning operation can be started. Simultaneous with this, the main chuck 19 is moved in the X and Y directions under the control of the controller 13, in such a manner that the soft cleaner 31 is located just under the probe needle 21A. Subsequently, the main chuck 19 is raised in the Z direction until the probe needle 21A comes into contact with the soft cleaner 31. The main chuck 19 is driven further for a distance of 100 $\mu$m or so, as shown in FIG. 2. Accordingly, the tip end of the probe needle 21A is stabbed into the cleaner layer 31A by that distance. At the time, most of the adherent substance enters into the interior of the cleaner layer 31A, and part of the adherent substance is scraped off the probe needle 21A due to the action of rubbing off the surface of the probe needle 21A, as shown in FIG. 7.

When the main chuck 19 is made to descend, the tip end of the probe needle 21A is pulled off the cleaner layer 31A. The substance adherent to the probe needle is partly scraped off inside the cleaner layer 31A and left there, and partly remains adhered. Thereafter, the main chuck 19 is moved in the X and Y directions, and the probe needles 21A are cleaned by the soft cleaner 31 at the respective positions. In this manner, all probe needles 21A are cleaned by the soft cleaner 31. After this cleaning, part of the substance remains adhered to the portion which is somewhat upper than the tip end.

Then, the main chuck 19 is moved in the X and Y directions, so as to move the X brush cleaner 32 to the position which is just under the probe needle 21A. In this state, the main chuck 19 is raised in the Z direction until the probe needle 21A comes into contact with the X brush cleaner 32. When the main chuck 19 is raised further, the tip end of each glass fiber is brought into elastic contact with the tiny depression formed in the tip end face of the probe needle 21A. Due to the elasticity of the glass fiber, the substance D is picked out from the tiny depression. When the main chuck is driven further, the substance remaining on the probe needle 21A enter the regions between the glass fibers. In this manner, the substance adherent to the probe needle 21A is removed by the glass fibers.

While the main chuck 19 is repeated moved up and down, the probe needle 21A is surely cleaned of the adherent substance. Thereafter, the main chuck 19 is moved in the X and Y directions, and the main chuck 19 is moved up and down at the respective positions. Hence, the probe needles 21A are cleaned by means of the X brush cleaner 32. During this cleaning process, the X brush cleaner 32 moves in the range (A) which is indicated by the two-dot-chain lines in FIG. 5, so that the probe needles 21A that are used for inspecting the oblique line portion on the wafer W are cleaned.

It should be noted that the probe needles 21A that are used for inspecting the wafer's "white" portion depicted in FIG. 5 (i.e., the portion other than the oblique line portion) cannot be cleaned by means of the X brush cleaner 32. Such probe needles 21A can be cleaned by means of the Y brush cleaner 33 instead. The X brush cleaner 32 moves within the range (A) indicated by the two-dot-chain lines in FIG. 5, while the Y brush cleaner 33 moves within the range (B) indicated by the one-dot-chain lines in the same Figure. With this structure, even the probe needles 21A used for inspecting the "white" portion of the wafer W can be cleaned by the Y brush cleaner 33.

As described above, according to the embodiment of the present invention, the cleaning mechanism 30 for cleaning the probing apparatus 10 comprises brush cleaners 32 and 33 and a soft cleaner 31. The brush sections 32A and 33A of the brush cleaners 32 and 33 are made of glass fibers that are thinner than the probe needles 21A and have a certain degree of elasticity. The cleaner layer of the soft cleaner 31 is formed of silicone rubber and inorganic filler. The probe needles 21A are cleaned first by the soft cleaner 31 and then by the brush cleaners 32 and 33. All probe needles 21A of the probe card are cleaned in such a manner that no substance is left adhered to the probe needles 21A, and the embodiment does not entail an increase in the installation area of the probing apparatus 10.

The cleaning layer 31A of the soft cleaner 31 is formed of silicone rubber and inorganic filler. This structure is effective in reliably removing the substance from the surfaces of the probe needles 21A. In addition, the brush sections 32A and 33A of the brush cleaners 32 and 33 are made of glass fibers which are thinner than the probe needles 21A and have a certain degree of elasticity. With this structure, the substance present in the tiny depressions in the surfaces of the probe needles 21A can be reliably picked out and removed by the glass fibers. Even in the case where the probe needles 21A are a vertically support type (FIG. 9) which is supported at a position closer to the tip end, the substance adherent to the support board can be cleaned by the brush cleaners 32 and 33.

In the embodiment described above, the cleaning mechanism is made up of a soft cleaner and a bush cleaner. Needless to say, the cleaning mechanism may be made up of a brush cleaner and a sandpaper cleaner (i.e., a cleaner employing cleaning means such as sandpaper).

The present invention is not limited to the embodiment described above. Any cleaning method falls within the range of the present application, as long as the cleaning mechanism employed in the method comprises a soft cleaner/a brush cleaner, and a brush cleaner/a sandpaper cleaner, and probe needles are cleaned first by the soft cleaner (the sandpaper cleaner) and then by the brush cleaner.

According to the present invention, it is possible to provide a cleaning mechanism and a cleaning method which enable adherent substance to be removed effectively from the probe needles of a probe card, and which does not necessitate an increase in the installation area of the probe apparatus.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. In combination with a probing apparatus having probe needles used for inspecting electric characteristics of an object, a cleaning mechanism for cleaning the probe needles, said cleaning mechanism comprising:

at least one brush cleaner having bristles which are formed of fiber members thinner than the probe needles; and at least one soft cleaner having a cleaner layer made of rubber and inorganic filler.

2. The cleaning mechanism according to claim 1, wherein the fiber members are stiff but bendable at any lengthwise portion thereof.

3. The cleaner mechanism according to claim 2, wherein said brush cleaner includes:

an X brush cleaner shifted from the soft cleaner in a first direction; and a Y brush cleaner shifted from the soft cleaner in a second direction different from said first direction.

4. The cleaning mechanism according to any one of claims 2 and 3, wherein said bristles of the brush cleaner are made of at least one of two kinds of fibers that include glass fibers and carbon fibers.

5. A cleaning method for cleaning probe needles used for inspecting electric characteristics of an object, said cleaning method comprising the steps of:

cleaning the probe needles by use of a soft cleaner having a cleaner layer made of rubber and inorganic filler; and cleaning the probe needles by use of a brush cleaner having bristles which are formed of fiber members thinner than the probe needles.

6. The cleaning method according to claim 5, wherein the bristles of the brush cleaner are made of at least one of two kinds of fibers that include glass fibers and carbon fibers.

* * * * *